(12) United States Patent
Yang et al.

(10) Patent No.: US 8,958,203 B2
(45) Date of Patent: Feb. 17, 2015

(54) ELECTRONIC DEVICE WITH AIR GUIDING APPARATUS

(71) Applicants: Cheng-Hsiu Yang, New Taipei (TW); Li-Chen Chang, New Taipei (TW)

(72) Inventors: Cheng-Hsiu Yang, New Taipei (TW); Li-Chen Chang, New Taipei (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 196 days.

(21) Appl. No.: 13/663,489

(22) Filed: Oct. 30, 2012

(65) Prior Publication Data

US 2014/0104783 A1 Apr. 17, 2014

(30) Foreign Application Priority Data

Oct. 11, 2012 (TW) .............................. 101137390 A

(51) Int. Cl.
  H05K 7/20 (2006.01)
  H01L 23/34 (2006.01)
  H05K 5/00 (2006.01)
  H01L 23/467 (2006.01)

(52) U.S. Cl.
  CPC .......... *H05K 7/20145* (2013.01); *H01L 23/467* (2013.01)
  USPC ................. 361/679.51; 361/679.49; 361/695; 454/184; 312/236

(58) Field of Classification Search
  CPC .. H01L 23/46; H01L 23/467; H05K 7/20145; H05K 7/20163; G06F 1/20; G06F 2200/201
  USPC ....................... 361/679.46–679.54, 688–723; 165/80.1–80.2; 454/184; 312/236; 174/16.1, 16.3, 547, 548
  See application file for complete search history.

(56) References Cited

U.S. PATENT DOCUMENTS

| | | | | |
|---|---|---|---|---|
| 3,039,377 | A * | 6/1962 | Wernli | 454/184 |
| 5,493,457 | A * | 2/1996 | Kawamura et al. | 720/648 |
| 5,871,396 | A * | 2/1999 | Shen | 454/184 |
| 6,147,862 | A * | 11/2000 | Ho | 361/679.32 |
| 7,403,387 | B2 * | 7/2008 | Pav et al. | 361/694 |
| 7,643,292 | B1 * | 1/2010 | Chen | 361/695 |
| 7,965,505 | B2 * | 6/2011 | Peng et al. | 361/695 |
| 2011/0053485 | A1 * | 3/2011 | Huang et al. | 454/184 |
| 2011/0220323 | A1 * | 9/2011 | Tan et al. | 165/96 |

* cited by examiner

*Primary Examiner* — Zachary M Pape
(74) *Attorney, Agent, or Firm* — Novak Druce Connolly Bove + Quigg LLP

(57) ABSTRACT

An electronic device includes a chassis and an air guiding apparatus. The chassis includes a bottom wall, a first sidewall, a second sidewall, a first end wall, a second end wall, a circuit board mounted on the bottom wall, and a fan. The air guiding apparatus includes a flexible air guiding piece. The first and second end walls each define a number of vents. A chip is mounted on the circuit board. The fan is installed in the chassis adjacent to the vents of the second end wall. The air guiding apparatus is fixed to the first end wall. A first end of the air guiding piece is stretchable to be fixed to the second end wall. The air guiding piece, the first sidewall, the first end wall, and the second end wall cooperatively bound an airflow channel for receiving the fan and the chip.

6 Claims, 3 Drawing Sheets

ELECTRONIC DEVICE WITH AIR GUIDING APPARATUS

BACKGROUND

1. Technical Field

The present disclosure relates to the cooling of electronic devices and, particularly, to an electronic device with an air guiding apparatus for guiding airflow.

2. Description of Related Art

Central processing units and memory cards generate a great amount of heat in the chassis of an electronic device. The heat needs to be dissipated immediately to ensure the continued proper function of the electronic devices. A cooling fan is provided to generate airflow, and an air duct guides the airflow. However, the contemporary air duct can only select the mating chassis of the electronic device. If the size of the chassis is changed, the air duct cannot be installed in the chassis, and the air duct cannot selectively mate with chassis of different sizes.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The present disclosure, including the accompanying drawings, is illustrated by way of examples and not by way of limitation. It should be noted that references to "an" or "one" embodiment in this disclosure are not necessarily to the same embodiment, and such references mean at least one.

Figure 1:
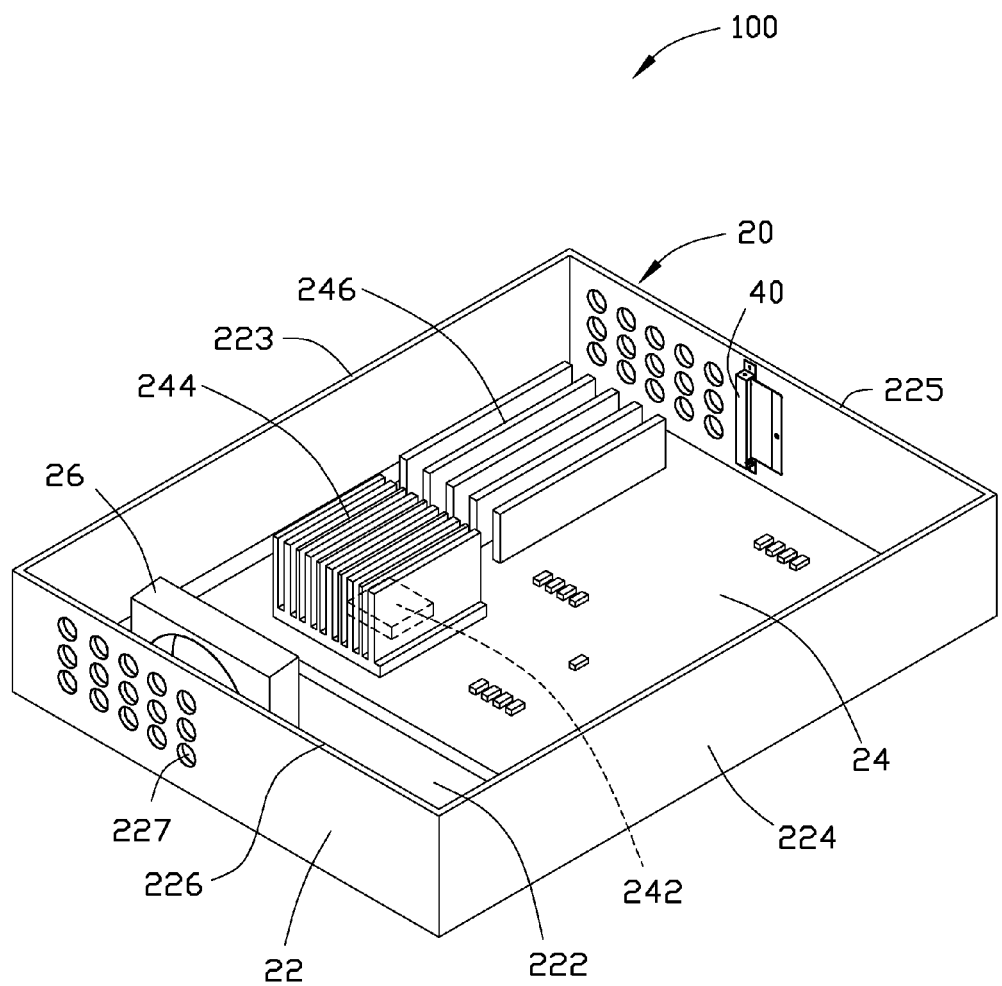
FIG. 1 is an isometric view of an exemplary embodiment of an electronic device, wherein the electronic device includes an air guiding apparatus.

FIG. 1 shows an exemplary embodiment of an electronic device 100. The electronic device 100 includes a chassis 20 and an air guiding apparatus 40.

The chassis 20 includes a case 22, a circuit board 24 received in the case 22, and a fan 26 received in the case 22. The case 22 includes a rectangular bottom wall 222, a first sidewall 223 perpendicularly extending up from a first side of the bottom wall 222, a second sidewall 224 perpendicularly extending up from a second side of the bottom wall 222 opposite to the first sidewall 223, a first end wall 225 perpendicularly extending up from a first end of the bottom wall 222, and a second end wall 226 perpendicularly extending up from a second end of the bottom wall 222 opposite to the first end wall 225. The first and second end walls 225 and 226 each define a plurality of vents 227 adjacent to the first sidewall 223. The circuit board 24 is mounted on the bottom wall 222. A chip 242 is mounted on the circuit board 24, a heat sink 244 is mounted on the chip 242, and a plurality of memories 246 is mounted on the circuit board 24 between the heat sink 244 and the first end wall 225. The fan 26 is located between the vents 227 of the second end wall 226 and the heat sink 244. In the embodiment, the chip 242 is a central processing unit.

Figure 2:
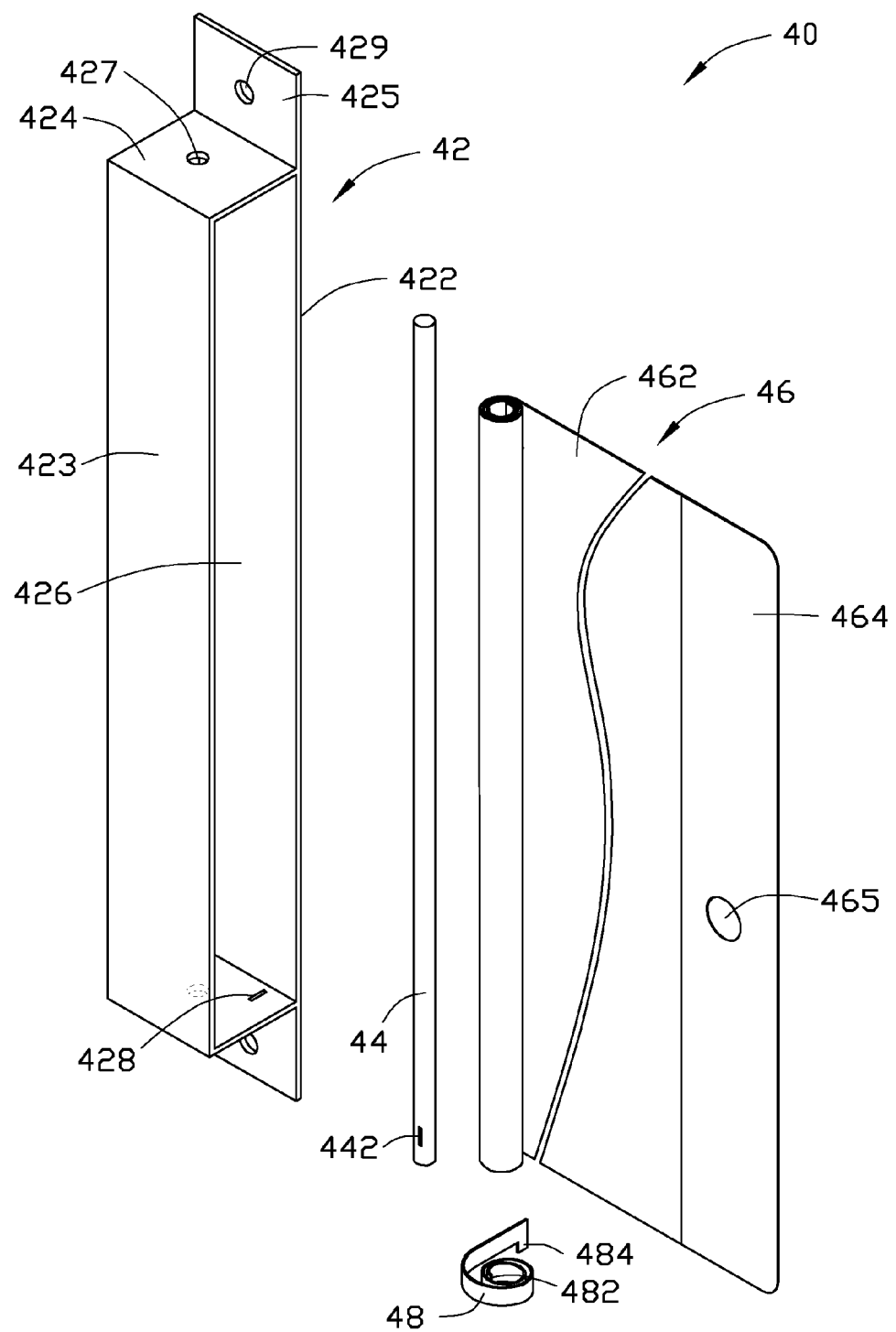
FIG. 2 is an exploded, isometric view of the guiding apparatus of FIG. 1.

FIG. 2 shows the air guiding apparatus 40. The air guiding apparatus 40 includes a bracket 42, a shaft 44, a flexible air guiding member 46, and a resilient member 48.

The bracket 42 includes a rectangular bottom plate 422, a top plate 423 opposite and parallel to the bottom plate 422, and two end plates 424 respectively connected between corresponding ends of the bottom wall 422 and the top wall 423. The bottom plate 422, the top plate 423, and the end plates 424 cooperatively bound a receiving space 426. The end plates 424 define two opposite shaft holes 427. One of the end plates 424 defines a latching hole 428 adjacent to the corresponding shaft hole 427. Two tabs 425 extend out from the opposite ends of the bottom plate 422. Each tab 425 defines a through hole 429.

Two opposite ends of the shaft 44 are rotatably inserted in the shaft holes 427. The circumference of one of the ends of the shaft 44 longitudinally defines a long positioning hole 442.

The air guiding member 46 includes a rectangular guiding piece 462 and a position portion 464 extending from a first end of the guiding piece 462. The guiding piece 462 is made of resilient and heat-resisting material, such as copper, or steel. A middle of the position portion 464 defines a position hole 465.

The resilient member 48 is a clockwork spring, and includes a first positioning end 482 at an inner side of the resilient member 48, and a second positioning end 484 at an outer side of the resilient member 48.

In assembly, a second end of the guiding piece 462 opposite to the positioning portion 464 is fixed to the shaft 44. The shaft 44 is rotated to reel the guiding piece 462 about the shaft 44. The resilient member 48 is fitted about the end of the shaft 44 defining the positioning hole 442. The first positioning end 482 of the resilient member 48 is latched in the positioning hole 442 of the shaft 44. A combination of the shaft 44, the guiding piece 462, and the resilient member 48 is received in the receiving space 426 of the bracket 42. The ends of the shaft 44 are rotatably inserted in the shaft holes 427 of the bracket 42. The second positioning end 484 of the resilient member 48 is latched in the latching hole 428 of the bracket 42. The position portion 464 extends out of the receiving space 426. The air guiding piece 462 can be wound on or let out from the shaft 44 as the shaft 44 rotates.

The air guiding apparatus 40 is attached to the chassis 20. Two fasteners (not shown) extend through the through holes 429 of the tabs 425, to be fastened to the first end wall 225 adjacent to the vents 227.

Figure 3:
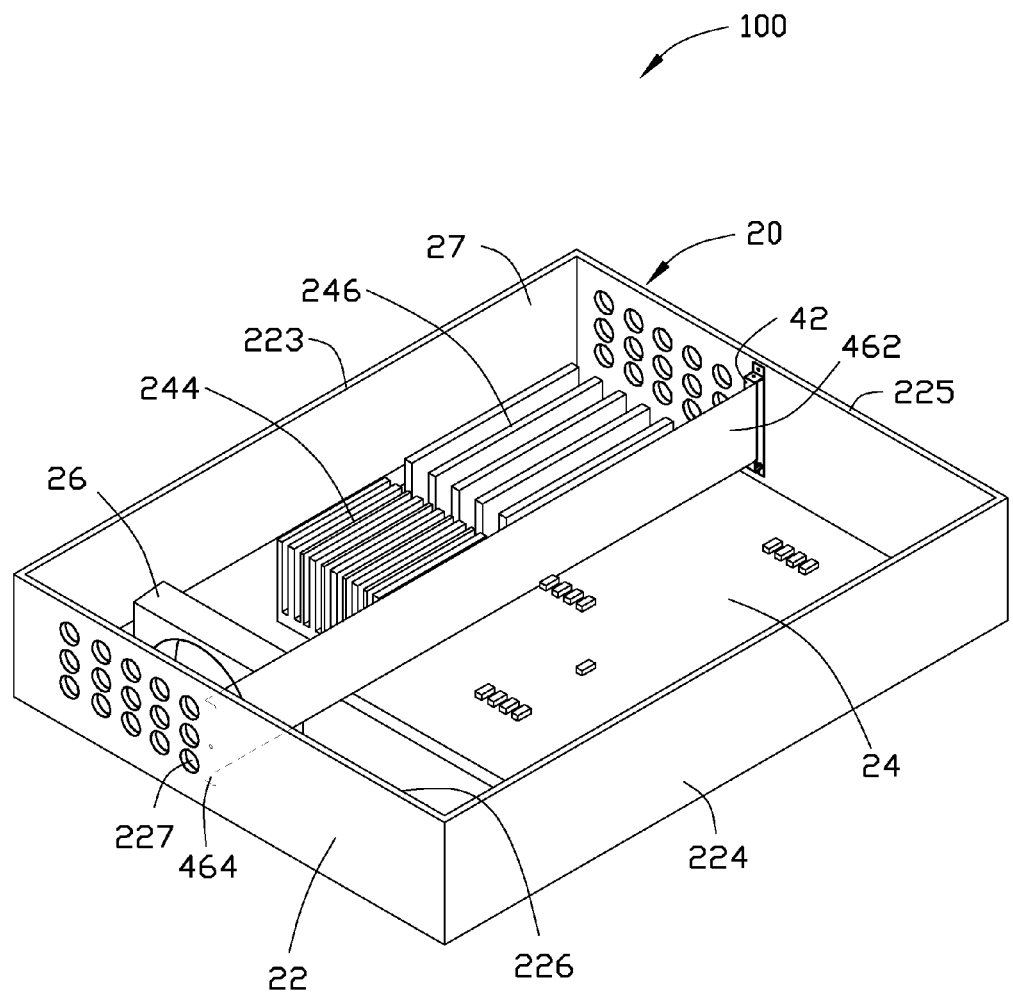
FIG. 3 is similar to FIG. 1, but showing the air guiding apparatus in use.

Referring to FIG. 3, in use, the position portion 464 of the air guiding member 46 is pulled out. The shaft 44 is rotated, thereby deforming the resilient member 48. The position portion 464 is extended to the second end wall 226 adjacent to the vents 227, and fixed to the second end wall 226 by screwing or latching. Thus, the guiding piece 462, the first end wall 225, the second end wall 226, and the first sidewall 223 cooperatively bound an airflow channel 27. The fan 26, the heat sink 244, and the memories 246 are received in the airflow channel 27. The fan 26 operates and draws airflow into the channel 27 through the vents 227 of the second end wall 226. The airflow flows through the heat sink 244 and the memories 246 to dissipate heat for the chip 242 and the memories 246, and is then exhausted out of the channel 27 through the vents 227 of the first end wall 225.

When a layout of the circuit board 24 needs to be changed, the positions of the air guiding piece 462 needs to changed, the position portion 464 is disengaged from the second end wall 226. The resilient member 48 is restored to bias the shaft 84 to rotate, and the guiding piece 462 is withdrawn back into the receiving space 426 of the bracket 42. The position portion 464 is pulled out again, and is mounted to a proper position of the case 22 for guiding airflow. The guiding piece 462 can be extended for suiting different specifications or sizes of the chassis 20

While the disclosure describes examples and embodiments, it is to be understood that the disclosure is not limited thereto. To the contrary, the disclosure is intended to cover various modifications and similar arrangements as would be apparent to those skilled in the art. Therefore, the scope of the appended claims should be accorded the broadest interpretation so as to encompass all such modifications and similar arrangements.

What is claimed is:

1. An electronic device, comprising:
    a chassis comprising a bottom wall, a first sidewall and a second sidewall respectively extending up from two opposite sides of the bottom wall, a first end wall and a second end wall respectively extending up from two opposite ends of the bottom wall, a circuit board mounted on the bottom wall, and a fan; and
    an air guiding apparatus comprising a flexible air guiding piece;
    wherein the first and second end walls each define a plurality of vents, a chip is mounted on the circuit board, the fan is installed in the chassis adjacent to the second end wall and aligning with the vents of the second end wall, the air guiding apparatus is fixed on an inner side of the first end wall adjacent to the vents of the first end wall, the air guiding piece is operable to be pulled from a first end of the air guiding piece to be stretched to the second end wall, with the first end being fixed to the second end wall, thus, the air guiding piece, the first sidewall, the first end wall, and the second end wall cooperatively bound an airflow channel, the fan and the chip are received in the airflow channel.

2. The electronic device of claim 1, wherein the air guiding apparatus further comprises a bracket fixed on an inner surface of the first end wall, a shaft rotatably installed to the bracket, and a resilient member connected between the bracket and the shaft for restoring the shaft, a second end of the air guiding piece is fixed to the shaft, the guiding piece is reeled about the shaft.

3. The electronic device of claim 2, wherein the bracket comprises a bottom plate fixed on the inner surface of the first end wall, a top plate opposite to the bottom plate, and two end plates connected between ends of the top plate and the bottom plate, the bottom plate, the top plate, and the end plates cooperatively bound a receiving space for receiving the air guiding piece, the end plates define two opposite shaft holes, two ends of the shaft are rotatably inserted in the shaft holes.

4. The electronic device of claim 2, wherein the resilient member comprises a first position end connected to the shaft, and a second position end connected to the bracket.

5. The electronic device of claim 4, wherein the resilient member is a clockwork spring.

6. The electronic device of claim 1, wherein the chip is a central processing unit, a heat sink is mounted on the chip, the fan is located between the vents of the second end wall and the heat sink.

\* \* \* \* \*